(12) United States Patent
Steadman Booker et al.

(10) Patent No.: US 11,181,488 B2
(45) Date of Patent: Nov. 23, 2021

(54) MULTI-LAYER DETECTOR WITH A MONOLITHIC SCINTILLATOR

(71) Applicant: KONINKLIJKE PHILIPS N.V., Eindhoven (NL)

(72) Inventors: Roger Steadman Booker, Aachen (DE); Walter Ruetten, Linnich (DE)

(73) Assignee: KONINKLIJKE PHILIPS N.V., Eindhoven (NL)

(*) Notice: Subject to any disclaimer, the term of this patent is extended or adjusted under 35 U.S.C. 154(b) by 89 days.

(21) Appl. No.: 16/642,292

(22) PCT Filed: Aug. 20, 2018

(86) PCT No.: PCT/EP2018/072383
§ 371 (c)(1),
(2) Date: Feb. 26, 2020

(87) PCT Pub. No.: WO2019/042797
PCT Pub. Date: Mar. 7, 2019

(65) Prior Publication Data
US 2021/0072167 A1 Mar. 11, 2021

Related U.S. Application Data

(60) Provisional application No. 62/552,563, filed on Aug. 31, 2017.

(51) Int. Cl.
*G01T 1/20* (2006.01)
*G01T 1/29* (2006.01)
(Continued)

(52) U.S. Cl.
CPC .......... *G01N 23/046* (2013.01); *G01T 1/202* (2013.01); *G01T 1/20183* (2020.05);
(Continued)

(58) Field of Classification Search
CPC . G01N 23/06; G01T 1/20183; G01T 1/20185; G01T 1/202; G01T 1/2985; H01L 27/14663
See application file for complete search history.

(56) References Cited

U.S. PATENT DOCUMENTS

| 9,000,382 B2 | 4/2015 | Mattson |
| 2010/0220833 A1 | 9/2010 | Levene |

(Continued)

FOREIGN PATENT DOCUMENTS

| WO | WO2012127403 A2 | 9/2012 |
| WO | WO2015131102 A1 | 9/2015 |

OTHER PUBLICATIONS

PCT International Search Report, International application No. PCT/EP2018/072383, dated Dec. 11, 2018.
(Continued)

*Primary Examiner* — Mark R Gaworecki
(74) *Attorney, Agent, or Firm* — Larry Liberchuk (57) ABSTRACT

A computed tomography (CT) detector array (120) includes a monolithic scintillator (124). The monolithic scintillator includes at least a first scintillator region (202), a second scintillator region (206), and an optically reflective barrier (210) therebetween. The detector array is configured to detect X-ray radiation traversing an examination region and impinging the monolithic scintillator and generate first projection data indicative of an energy of x-ray radiation absorbed by the first scintillator region and second projection data indicative of an energy of x-ray radiation traversing the first scintillator and absorbed by the second scintillator region.

20 Claims, 5 Drawing Sheets

(51) Int. Cl.
 G01N 23/04 (2018.01)
 H01L 27/146 (2006.01)
 G01N 23/046 (2018.01)
 G01T 1/202 (2006.01)
(52) U.S. Cl.
 CPC ........ *G01T 1/20185* (2020.05); *G01T 1/2985* (2013.01); *H01L 27/14663* (2013.01)

(56) References Cited

U.S. PATENT DOCUMENTS

| | | |
|---|---|---|
| 2011/0192982 A1 | 8/2011 | Henseler |
| 2012/0250822 A1* | 10/2012 | Helm .................... A61B 6/587 378/62 |
| 2014/0306116 A1 | 10/2014 | Roessl |
| 2015/0226862 A1 | 8/2015 | Lewellen |

OTHER PUBLICATIONS

Sabet H. et al., "Laser Pixelation of Thick Scintillators for Medical Imaging Applications: X-Ray Studies", Medical Applications of Radiation Detectors III, Proc. of SPIE vol. 8853, 88530B—© 2013 SPIE.

Yoshida E. et al., "Intrinsic Spatial Resolution Evaluation of the X'tal Cube PET Detector Based on a 3D Crystal Block Segmented by Laser Processing", Radiological Physics and Technology, vol. 6, No. 1, Jul. 11, 2012 (Jul. 11, 2012), pp. 21-27.

Sabet H. et al., "A Sub-mm Spatial Resolution LYSO:Ce Detector for Small Animal PET", 2015 IEEE Nuclear Science Symposium and Medical Imaging Conference (NSS/MIC), 2015.

* cited by examiner

MULTI-LAYER DETECTOR WITH A MONOLITHIC SCINTILLATOR

FIELD OF THE INVENTION

The following generally relates to an imaging detector and more particularly to a multi-layer detector with a monolithic scintillator, and is described with particular application to multi-energy (spectral) computed tomography (CT).

BACKGROUND OF THE INVENTION

A spectral CT imaging system includes a single broadband source, multiple sources, and/or kVp switching to emit x-ray radiation. The emitted x-ray radiation traverses an examination region with an object or subjected located within. One configuration includes a multi-layer detector array, located across the examination region from the source that detects x-ray radiation traversing the examination region and impinging thereon. The multi-layer detector array includes multiple detector modules, each with multiple detector elements that extend in one or two dimensions in a direction transverse to the incident radiation. The X-ray radiation receiving surfaces of the detector elements are also referred to as pixels herein.

With a dual layer configuration, each detector element includes two layers of cuboid shaped and/or frustrum of a square right pyramid shaped scintillators (or scintillator voxels). The layers are stacked one on top of another and the stack extends in a direction of the incident radiation. A first scintillator in a first layer receives and absorbs X-ray radiation of a first predetermined energy range and produces first light radiation indicative thereof. X-ray radiation greater than the first predetermined energy range traverses the first scintillator and is detected by a second scintillator in a second layer, which receives and absorbs this X-ray radiation and produces second light radiation indicative thereof. The light radiation is detected by corresponding photosensors, such as photodiodes, which produce electrical signals indicative of an energy of the X-ray radiation.

Photosensors can be arranged in a vertical or horizontal configuration. In a vertical configuration photosensors are arranged between scintillators and occupy a portion of a surface of the detector that receives the X-ray radiation. In other words, the photosensors arranged as an array are generally parallel to the incident radiation. In a horizontal configuration, photosensors are placed in front of or behind the scintillators relative to the X-ray radiation. In other words, the photosensors arranged as an array are generally perpendicular to the incident radiation. When placed in front of or between the X-ray radiation and the scintillator, it is advantageous for the photosensors to be transparent to the X-ray radiation, such that the X-ray radiation passes through the photosensors and is then absorbed by the scintillators.

Each scintillator in each layer of each detector element is typically coated with optically reflective material (e.g., titanium dioxide ($TiO_2$), white paint, etc.) on five of six sides of the cuboid with a sixth side adjacent a corresponding photosensor. There is a mechanically produced physical separation (e.g., a gap) between layers, and the optically reflective material is disposed in this physical separation. The optically reflective material can mitigate cross talk of light between scintillator of each layer and/or voxel, improve detection efficiency, and/or direct the light to the corresponding photosensor where it is converted to an electrical signal.

Each scintillator of each layer of each detector element has been mechanically produced (e.g., with a saw, a wire, etc.) and coated with the optically reflective material, and then the scintillators are aligned and stacked. The aligning and stacking process can be complex, and it can be difficult to accurately align and stack the scintillators. Generally, a surface of a first scintillator in a first layer should align with and match a corresponding surface of a second scintillator in a second layer of the same detector element, and the scintillators should align with the corresponding photosensors of each layer. Unfortunately, inaccurate alignment and/or stacking can lead to detection inefficiencies and degraded image quality.

SUMMARY OF THE INVENTION

Aspects described herein address the above-referenced problems and others.

The following describes embodiments of a multi-layer detector of monolithic scintillators with an optical barrier. Each detector element includes the monolithic scintillator or a single block of scintillator material with optically reflective barriers disposed within the monolithic scintillator and in between scintillator regions. The scintillator regions are disposed in sequence along a direction of incident radiation. Each optically reflective barrier is induced by a laser. In some embodiments, a single physical bulk of scintillator material and optically reflective barrier induced by the laser extend to a 1×N array of monolithic scintillators, where N is an integer. In some embodiments, the single physical bulk of scintillator material and optically reflective barrier extend to an M×N array of monolithic scintillators, where M and N are integers. In some embodiments, each optically reflective barrier includes two closely spaced barriers induced by the laser.

In one aspect, a computed tomography (CT) detector array includes a monolithic scintillator. The monolithic scintillator includes at least a first scintillator region, a second scintillator region, and an optically reflective barrier therebetween. The detector array detects X-ray radiation traversing an examination region and impinging the monolithic scintillator and generates first projection data indicative of an energy of x-ray radiation absorbed by the first scintillator region and second projection data indicative of an energy of x-ray radiation traversing the first scintillator and absorbed by the second scintillator region.

In another aspect, a computed tomography system includes an X-ray radiation source configured to emit X-ray radiation that traverses an examination region, and a detector array located opposite the X-ray radiation source across the examination region. The detector array includes a monolithic scintillator that includes at least a first scintillator region, a second scintillator region, and an optically reflective barrier therebetween. The detector array detects X-ray radiation traversing the examination region and impinging the monolithic scintillator and generates first projection data indicative of an energy of x-ray radiation absorbed by the first scintillator region and second projection data indicative of an energy of x-ray radiation traversing the first scintillator and absorbed by the second scintillator region.

In another aspect, a method of manufacturing a computed tomography (CT) radiation detecting apparatus includes altering a crystal structure of a portion of a single physical bulk of scintillator material by a focused laser to define a plurality of regions of a monolithic scintillator while maintaining the single physical bulk as a physically connected crystal structure. The altered portion includes a volume with a major surface and the major surface oriented parallel to a surface of the detecting apparatus configured to initially receive X-ray radiation.

These and other aspects of the invention will be apparent from and elucidated with reference to the embodiment(s) described hereinafter.

BRIEF DESCRIPTION OF THE DRAWINGS

The invention may take form in various components and arrangements of components, and in various steps and arrangements of steps. The drawings are only for purposes of illustrating the preferred embodiments and are not to be construed as limiting the invention.

DETAILED DESCRIPTION OF EMBODIMENTS

Figure 1:
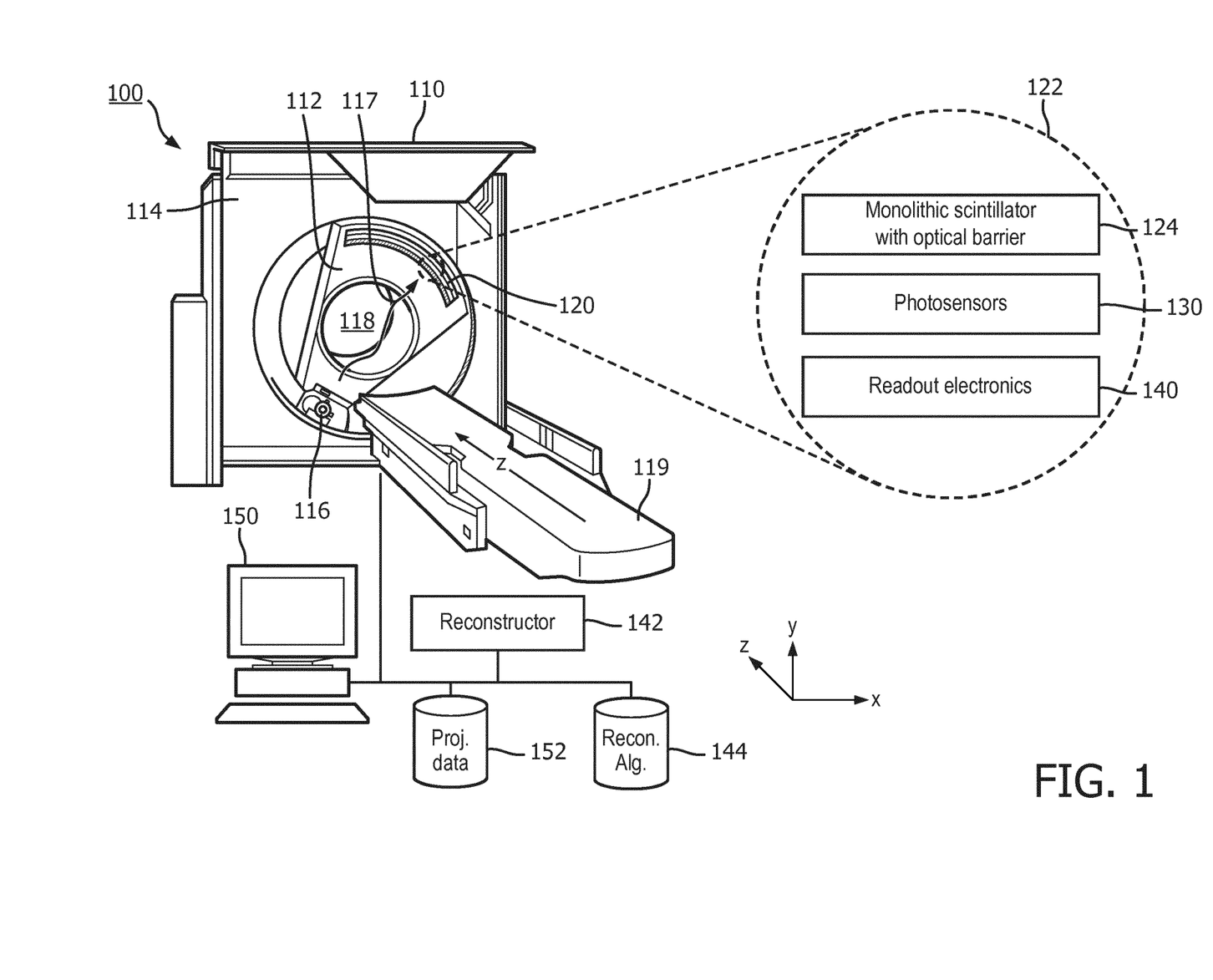
FIG. 1 schematically illustrates an embodiment of a CT system with a multi-layer detector array with a monolithic scintillator comprised of a plurality of individual scintillator regions.

With reference to FIG. 1, an embodiment of a computed tomography (CT) system 100 is schematically illustrated. The CT imaging system 100 includes a rotating gantry 112 supported by a stationary gantry 114. The CT imaging system 100 includes an X-ray radiation source 116 supported by the rotating gantry 112 and configured to emit X-ray radiation. The emitted X-ray radiation traverses an examination region 118. The X-ray radiation traversing the examination region 118 is detected by a multi (e.g., dual)-layer radiation sensitive detector array 120, which is supported by the rotating gantry 112, across from the X-ray radiation source 116. A subject support 119, such as a couch, supports an object or subject in the examination region 118.

A magnified view 122 of a portion of the multi-layer detector array 120 is illustrated. As shown in the view 122, the array 120 includes a monolithic scintillator 124. As described in greater detail below, the monolithic scintillator 124 includes a plurality of scintillator regions (scintillator voxels), and the regions are separated by an optically reflective barrier therebetween. The optically reflective barrier can be induced by one or more lasers, etc. The induced optically reflective barrier maintains the physical bulk of scintillator material as a single block while adding a reflective barrier between regions by changing the crystal structure of the scintillator material within dimensions of the optically reflective barrier.

An example of a suitably configured laser is discussed in WO 2015/131102A1, filed Feb. 27, 2015, and entitled "System and method for processing radiation detectors using laser beams." The scintillator material can include, but is not limited to, Gadolinium Oxysulfide (GOS, $Gd_2O_2S$), Yttrium Aluminum Garnet (YAG, $Y_3Al_5O_{12}$), Ce doped YAG (Ce-YAG, Ce $Y_3Al_5O_{12}$), Zinc Selenide (ZnSe), Cadmium Tungstate ($CdWO_4$), Gadolinium Aluminum Gallium Garnet (GAGG $Gd_3Al_2GA_3O_{12}$), Cerium doped GAGG (Ce $Gd_3Al_2GA_3O_{12}$), etc. The monolithic scintillator 124 mitigates the complexity associated with accurately aligning scintillator voxels, e.g., in a configuration in which layers of scintillator material in each detector element are physically separate and mechanically coupled together.

Each scintillator region of the monolithic scintillator 124 is disposed adjacent to and is optically coupled to a separate and corresponding photosensor 130. The photosensor 130 senses light from one scintillator region of the multiple scintillator regions corresponding to the photosensor 130. The photosensors 130 are operative to convert received light to an electrical signal (projection data), which can be further processed and/or routed by readout electronics 140. The electrical signal for a scintillator region is indicative of an energy of the x-ray photons absorbed in that scintillator region. As such, the electrical signals for a dual layer system will include a first set of electrical signals corresponding to one of the regions (e.g., the top region and lower energy photons) and a second set of electrical signals corresponding to the other region (e.g., the bottom region and higher energy photons).

A reconstructor 142 reconstructs the projection data with a reconstruction algorithm(s) 144, which can include a spectral reconstruction algorithm(s) and a non-spectral reconstruction algorithm(s). The non-spectral reconstruction algorithm(s) produces conventional broadband (non-spectral) volumetric image data, e.g., by combing the spectral projection data and reconstructing the combined volumetric image data. The spectral reconstruction algorithm(s) produces spectral volumetric image data, e.g., high and low energy volumetric image data, photo-electric effect and Compton scatter volumetric image data, bone and soft tissue volumetric image data, calcium and iodine volumetric image data sets, etc.

An operator console (computing device) 150 allows an operator to control an operation of the system 100. This includes selecting an imaging acquisition protocol (e.g., single or multi-energy), selecting a reconstruction algorithm (e.g., single or multi-energy), invoking scanning, invoking a visualization software application, interacting with an executing visualization software application, etc. The operator console 150 includes an output device(s) such as a display monitor, a filmer, etc., and an input device(s) such as a mouse, keyboard, etc.

Figure 2A:
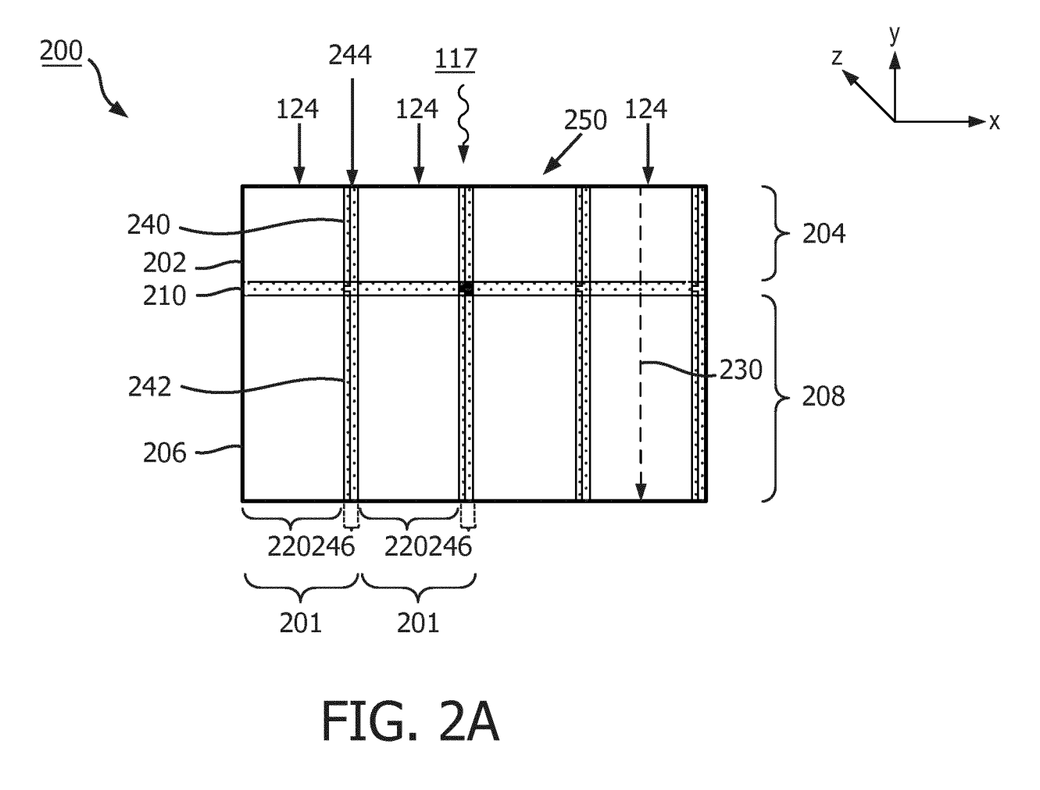
FIGS. 2A-2B schematically illustrate a vertical detector configuration of the array.
Figure 2B:
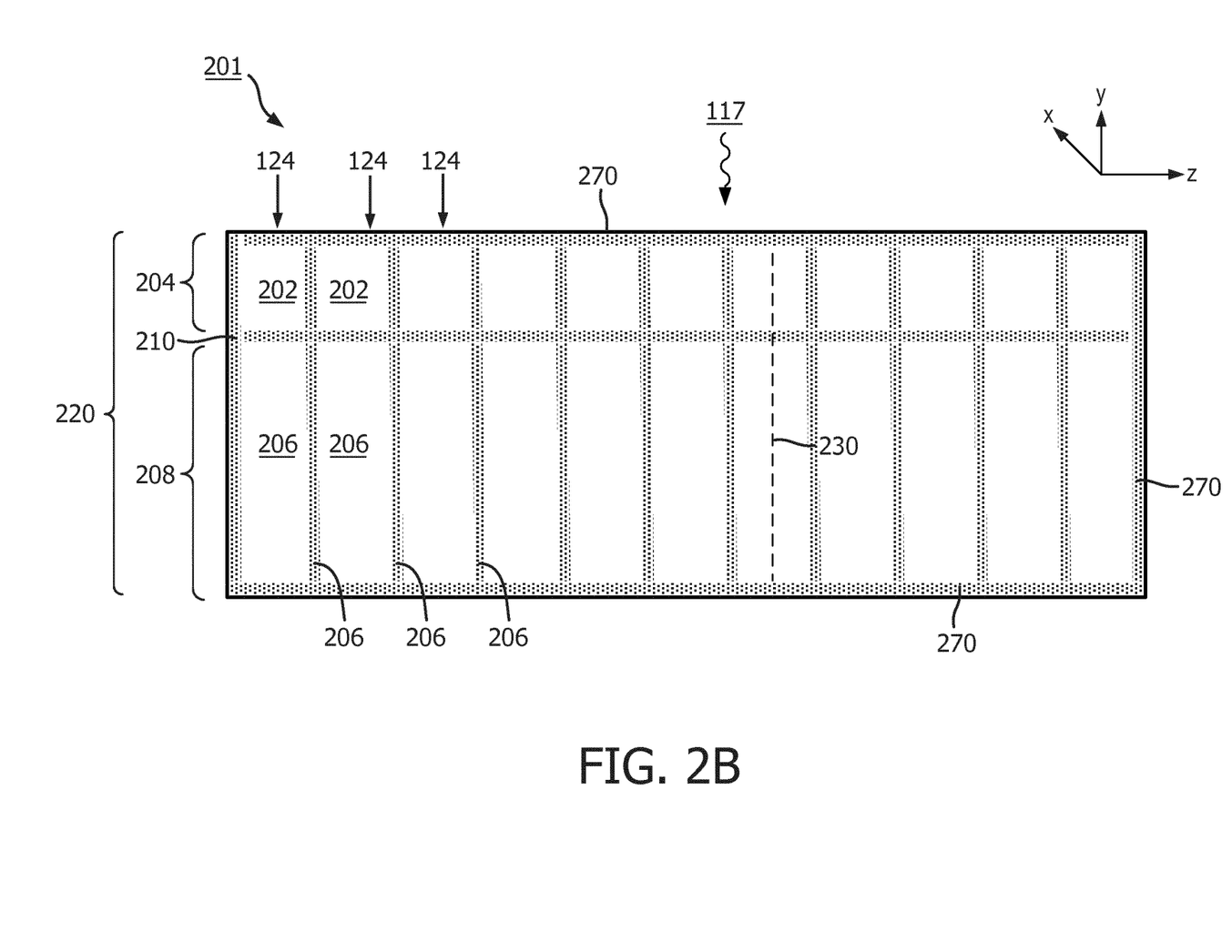

FIGS. 2A and 2B schematically illustrate a dual-layer vertical detector configuration 200 of a multi-layer radiation sensitive detector array 120. The vertical detector 200 includes a slab or row of voxels 201.

With reference to FIG. 2A, a sub-portion of a first row of the detector voxels 201 along an x-direction is schematically illustrated. In this embodiment, each row of detector voxels 201 includes the monolithic scintillator 124 with a first scintillator region 202 corresponding to a first scintillator layer 204, a second scintillator region 206 corresponding to a second scintillator layer 208, and an optically reflective barrier 210 there between, with the regions 202 and 206 and the optically reflective barrier 210 in a same physical scintillator material bulk 220. The optically reflective barrier 210 includes a major surface of a volume that separates the regions 202 and 206 and the major surface is parallel to a surface 250 receiving the incident radiation 117. In some instances, a position (e.g., depth) of the optically reflective barrier 210 in the bulk 220 maximizes an energy separation of the incident radiation.

The physical bulk 220 receives the incident radiation 117, having traversed to the examination region 118, and converts the X-ray radiation to light radiation at a depth 230 in the bulk material 220 relative to an energy of the X-ray photons of the incident radiation 117. In other words, lower energy (shallow penetrating) X-ray photons are absorbed in the first region 202, and higher energy (deeper penetrating) X-ray photons are absorbed in the second region 206.

Each of the regions 202 and 206 is optically coupled respectively to a different corresponding first and second photosensors 240 and 242 on a supporting substrate 244. For example, the first scintillator region 202 of the scintillator bulk material 220 is optically coupled to the first photosensor 240 of an array of photosensors 246 and the second scintillator region 204 of the scintillator bulk material 220 is optically coupled to the second photosensor 242 of the array of photosensors 246. The array of photosensors 246 includes the first photosensor 240, the second photosensor 242 and the substrate 244. The array of photosensors 246 is disposed adjacent to the monolithic scintillator 124 and occupies a portion of the surface 250. The disposition of the array of photosensors 242 and the regions 202 and 206 relative to a direction of the incident X-ray radiation identifies the dual layer detector 200 as a vertical arrangement.

FIG. 2B schematically illustrates a side view of the scintillator side of one row of the detector voxels 201 of FIG. 2A along the z-direction for a multi-row configuration. The same single physical scintillator material bulk 220 includes both scintillator regions of the dual layers for all for all of N rows of the multi-row configuration of the detector voxels 201, where N is a positive integer. That is, the same physical scintillator material bulk 220 can be considered a slab of the scintillator material with scintillator voxel (or pixel) optical barriers 260 that define each scintillator voxel for each row, and the optically reflective barrier 210 defining the two scintillator regions 202 and 206 within each scintillator voxel. The detector surface area of one pixel corresponds to the detector volume of a plurality of voxel regions. The scintillator voxel optical barriers 260 are optically reflective barriers, similar to the optically reflective barrier 210, e.g., they include changes in the crystal structure of the same physical bulk material 220 induced by laser. In some embodiments, the voxel optical barriers 260 define cuboid shaped voxels. In some embodiments, the voxel optical barriers 260 define frustum of a square right pyramid shaped voxels.

A thickness or depth (y-direction) of the optically reflective barrier 210 is dependent upon a diameter of a focal spot of the laser beam and a minimum thickness for optical separation according to the structure of altered scintillator material. In some embodiments, the thickness of the optically reflective barrier 210 can be increased by a plurality of altered positions by the focal spot of the laser. That is, the altered positions are further altered in the y-direction, where a major surface the volume of the optically reflective barrier is altered extending in the x-z direction.

The same physical scintillator material bulk 220 can include an outside or exterior surface 270, which is an optically reflective barrier induced by a laser. In some embodiments, the outside surface is unchanged by laser and an optically reflective coating is applied. Combinations of the outside surface 270 altered to the optically reflective barrier and the optically reflective coating are contemplated.

The dual layer detector array 200 illustrated in FIGS. 2A-2B is an M×N array of detector elements, with M slabs of scintillator material separated by the substrate 244 of the photosensor array 246 in a vertical arrangement, where M is a positive integer. Each slab includes N monolithic scintillator voxels within the same physical scintillator material bulk 220. An example of a vertical detector arrangement is discussed in U.S. Pat. No. 9,000,382, filed Oct. 29, 2009, and entitle "Spectral Imaging Detector," which is herein incorporated by reference its entirety.

Figure 3:
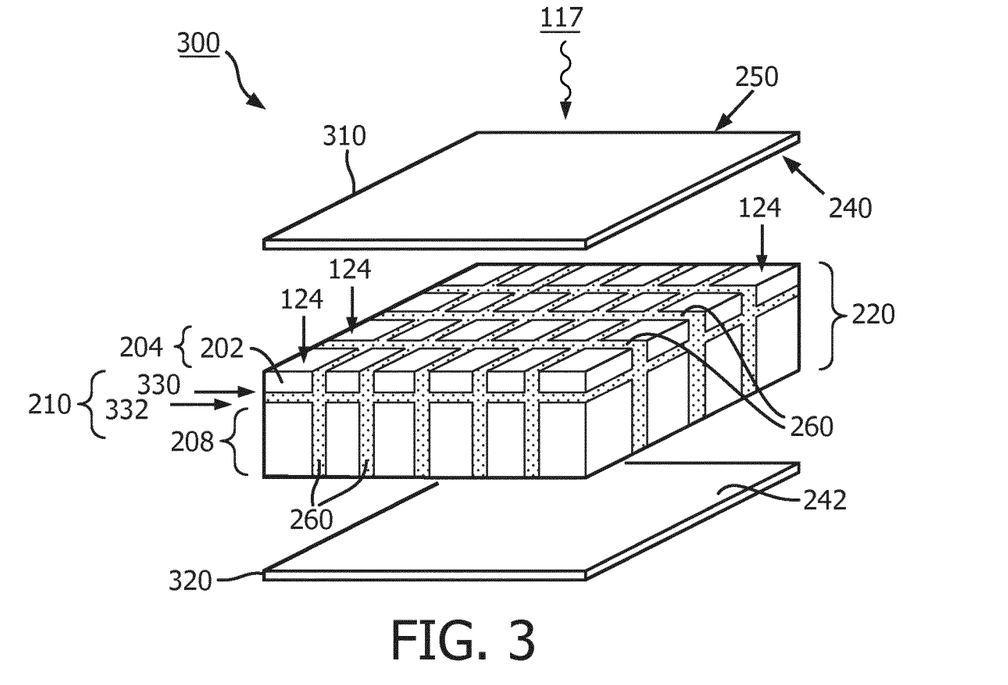
FIG. 3 schematically illustrates a horizontal detector configuration of the array.

With reference to FIG. 3, a dual-layer horizontal detector configuration 300 of the multi-layer radiation sensitive detector array 120 is illustrated. The configuration 300 includes a single physical bulk 220 of monolithic scintillators 124. Each monolithic scintillator 124 includes the two regions 202 and 206. The single physical bulk 220 of monolithic scintillators 124 is disposed between substrates of two arrays of photosensors 310 and 320. Each of the two arrays of photosensors 310, 320 is disposed in a plane parallel to the surface 250 of the dual layer detector 300.

The optically reflective barrier 210 of the same physical bulk 220 of scintillator material can include multiple sub-barriers such as two or more sub-barriers 330 and 332, which are separated from each other by a distance of 2-100 microns. Each of the barriers 330 and 332 includes a major surface of a volume defined by the barriers 330 and 332, which is substantially planar, with the major surface disposed parallel to the surface 250 of the dual layer detector 300. Each of the sub-barriers 330 and 332 includes changes to the crystal structure of the bulk material 220, e.g., induced by a laser beam.

The same physical scintillator material bulk 220 can include a plurality of individual monolithic scintillators 124 separated by the voxel optical barriers 260 and that form a multidimensional M×N array of voxels of the monolithic scintillators 124. The same physical scintillator material bulk 220 can include the optically reflective coating, the outside portion 270 of the same physical bulk 220 of the scintillator material altered structurally by laser to an optically reflective barrier, and combinations thereof.

The arrays of photosensors 310 and 320 can include front illuminated photodiodes (FIP), back illuminated photodiodes (BIP), organic photodiodes (OPD), and combinations thereof. One or more of the arrays of photosensors 310, 320 can include a photodiode array that minimizes x-ray absorption, such as OPDs, aggressively thinned FIPs, aggressively thinned BIPs, x-ray transparent photosensors, etc. In some embodiments, aggressively thinned means thinned to less than 30 microns. In some embodiments, aggressively thinned means thinned to 30-100 microns. In some embodiments, aggressively thinned means thinned to 100-200 microns. The array of photosensors 310 is optically coupled to the first layer 204 of the same physical bulk 220 of scintillator material, and corresponding photosensors 240 are dimensioned and aligned with corresponding the first regions 202 of each monolithic scintillator 124. The array of photosensors 320 opposite the first photosensor array 310 and the same physical bulk 220 of scintillator material is optically coupled to the second layer 206 of the same physical bulk 220 of scintillator material. The photosensors 244 of the second photosensor array 320 are dimensioned and aligned with corresponding second regions 206 of each voxel monolithic scintillator 124.

Figure 4:
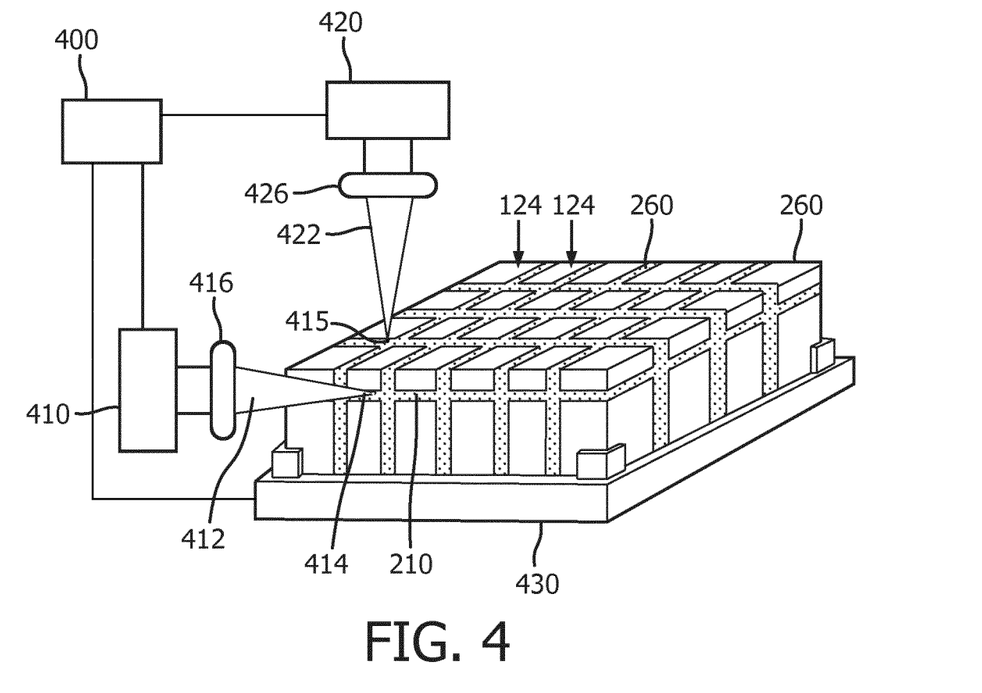
FIG. 4 schematically illustrates an embodiment of generating the individual scintillator regions.

With reference to FIG. 4, an embodiment of generating scintillator regions 202, 206 for voxels of the monolithic scintillator 124 is schematically illustrated. A controller 400 controls the operation of one or more lasers 410, 420 and relative positioning of the lasers 410, 420 to the same physical bulk 220 of scintillator material positioned by a holder 430. In some embodiments, a first laser 410 is positioned with a laser beam 412 oriented parallel to the optically reflective barrier 210. In some embodiments, a second laser 420 is positioned with a laser beam 422 oriented perpendicular to the optically reflective barrier 210. In some embodiments, one of the first laser 410 or the second laser 420 is omitted. In some embodiments, there are multiple lasers in either orientation.

The laser beam 412, 422 is focused on a point 414 by at least one lens 416, 426. The point 414, 415 can be spherical in shape or elongated along the direction of the laser beam 412, 422. The point 414, 415 changes the crystal structure of the same physical bulk 220 of scintillator material according to the operating characteristics of the laser 410, 420. The operating characteristics of the laser 410, 420 are relative to the scintillator material. For example, wavelength, power and pulse can vary according to the scintillator material to achieve the change in crystal structure for the optically reflective barrier 210.

The controller 400 moves the laser beam 412, 422 relative to the holder 430. In some embodiments, the laser 410, 420 is fixed and the holder 430 moves. In some embodiments, the laser 410, 420 moves and the holder 430 is fixed. In some embodiments, both the laser 410, 420 and the holder 430 move.

For example, with the second laser 420 omitted, and the first laser 410 generating both the optically reflective barrier 210 and the voxel optical barrier 260, the first laser 410 is configured to move the point 414 across positions in a most distant plane of the same physical bulk 220 of scintillator material, and then proceed to positions in a next closest plane successively until changes of the crystal structure for the optically reflective barrier 210 and voxel optical barrier 260 are induced. That is, the point 414 remains between barriers already created and the laser. With both the optically reflective barrier 210 and the voxel optical barrier 260 generated, the barriers connect with orthogonal, oblique or non-parallel surfaces. That is, a major surface of a volume defining the optically reflective barrier 210 is non-parallel to a major surface of a volume defining the voxel optical barrier 260.

Figure 5:
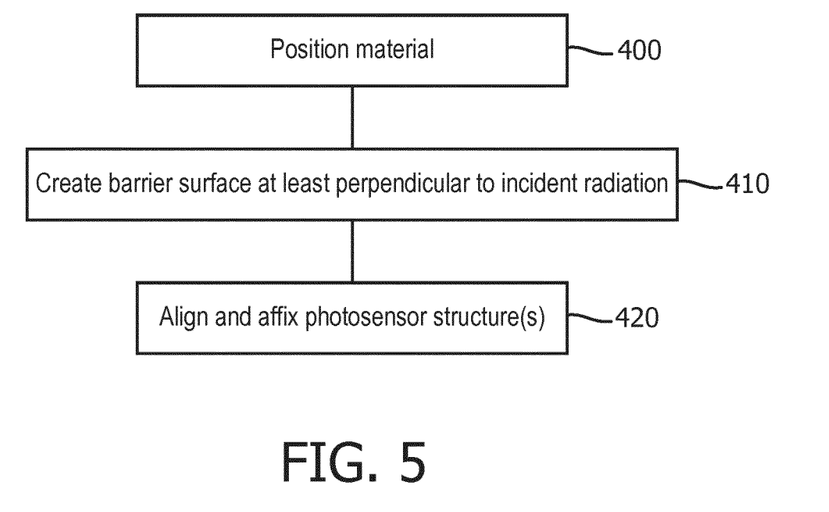
FIG. 5 illustrates a flowchart in accordance with an embodiment(s) herein.

With reference to FIG. 5 a flowchart in accordance with an embodiment(s) herein is illustrated.

At 500, the physical bulk 220 of scintillator material is positioned relative to one or more lasers 410, 420. The positioning can include receiving the physical bulk 220 of scintillator material in the holder 430. The positioning can include changes in position relative to the laser(s) to generate the optically reflective barrier 210 at a next location.

In some embodiments, the physical bulk 220 of scintillator material can include a volume of material for the monolithic scintillator 124 of a single voxel. In some embodiments, the physical bulk 220 of scintillator material can include a volume of material for a 1×N array of monolithic scintillators 124. In some embodiments, the physical bulk 220 of scintillator material can include a volume of material for an M×N array of monolithic scintillators 124.

In some embodiments, the holder is configured to hold combinations of the above. For example, slabs of scintillator material for a one dimensional array of monolithic scintillators 124, or material for individual monolithic scintillator blocks 124 can be held together in the holder 430 for generating the optically reflective barrier 210 across mechanically separated slabs or across individually mechanically separated voxels.

At 510, the crystal structure of a portion of the physical bulk 220 for monolithic scintillator blocks 124 is altered by a focused laser to define the plurality of regions in scintillator material for each voxel while maintaining the scintillator material as physically connected structure. The altered structural portion forming the optically reflective barrier 210 is oriented parallel to a surface 250 of the physical bulk 220 of scintillator material configured to initially receive the incident radiation 117. The altered structural portion of the monolithic scintillator 124 can include two or more barriers 330, 332 parallel to the surface 250 configured to initially receive the incident radiation 117. The two barriers 330, 332 are parallel and separated by a distance between 2 microns and 100 microns. In some embodiments, the distance is between 25 and 100 microns.

In some embodiments, the altered structural portion further includes the voxel optical barrier 260 or a portion thereof. For example, for portions of the physical bulk 220 of scintillator material that are altered to form the voxel optical barrier 260, the altered portions further form a barrier perpendicular to the surface 250 configured to initially receive the incident radiation.

In some embodiments, the altered structural portion includes an outside surface 270, or a portion thereof, of the physical bulk 220 of scintillator material.

Acts 500 and 510 are repeated with re-positioning and generating the altered structural portion until the monolithic scintillators 124 are formed. The controller 400 is configured to control the positioning and operation of the laser(s) to generate the altered structural portion at each position in a proper order to form the optically reflective barrier 210, and in some embodiments additionally the voxel optical barrier 260 and/or the reflective barrier 270 on the outside surface.

At 520, the monolithic scintillator 124 are aligned with and affixed to one or more photosensor arrays. In some embodiments, the monolithic scintillators 124 form 1×N dimensional array of voxels, and the monolithic scintillator 124 of each voxel includes the plurality of regions 202, 206 corresponding to layers 204, 208 defined by the optically reflective barrier 210. For example, the photosensor array 246 is oriented perpendicular to a surface 250 of the multi-layer detector 120 which initially receives the incident radiation and aligned with and affixed to the physical bulk 220 of scintillator material. The first region 202 of each voxel aligns with the corresponding first photosensor 240 and the second region 206 of each voxel aligns with the corresponding second photosensor 242. The multi-layer detector array 120 as an M×N array of voxels can be further assembled with an assembly of M one dimensional arrays of voxels. The assembly can further include the addition of readout electronics 140. The assembly can further include the addition of a supporting substrate. The assembly can further include the application of a optically reflective coating.

In some embodiments, the generated monolithic scintillator blocks 124 formed from the structurally altered physical bulk 220 of the scintillator material include a two dimensional array of monolithic scintillators 124, and each monolithic scintillator 124 includes the plurality of regions 202, 206. The aligning and affixing includes aligning and affixing the generated monolithic scintillator 124 to a plurality of photosensor arrays 310, 320. Each of the plurality of photosensor arrays 310, 320 is oriented parallel to the surface 250 of the multi-layer detector that initially receives the incident radiation 117.

In some embodiments, the generated monolithic scintillators 124 formed from the structurally altered physical bulk 220 of the scintillator material are mechanically separated as individual monolithic scintillators 124, coated and re-assembled as either a 1×N array of monolithic scintillators 124 or an M×N array of monolithic scintillator 124.

The operation of the controller 410 for positioning and operation of the lasers 410, 420 may be implemented by way of computer readable instructions, encoded or embedded on a computer readable storage medium, which, when executed by a computer processor(s), cause the processor(s) to carry out the described acts. Additionally or alternatively, at least one of the computer readable instructions is carried out by a signal, carrier wave or other transitory medium. In some embodiments, the controller 410 includes an application specific integrated circuit.

The above steps can be performed in a different order and/or some steps can be omitted.

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims.

In the claims, the word "comprising" does not exclude other elements or steps, and the indefinite article "a" or "an" does not exclude a plurality. A single processor or other unit may fulfill the functions of several items recited in the claims. The mere fact that certain measures are recited in mutually different dependent claims does not indicate that a combination of these measures cannot be used to advantage.

The invention claimed is:

1. A computed tomography detector array, comprising:
   a monolithic scintillator that comprises
      a first scintillator region,
      a second scintillator region, and
      an optically reflective barrier therebetween;
   wherein the detector array is configured to detect X-ray radiation traversing an examination region and impinging the monolithic scintillator and generate first projection data indicative of an energy of x-ray radiation absorbed by the first scintillator region and second projection data indicative of an energy of x-ray radiation traversing the first scintillator and absorbed by the second scintillator region.

2. The detector array according to claim 1, wherein the monolithic scintillator comprises a portion of a physical bulk of scintillator material that is structurally altered by a laser to define the first scintillator region and the second scintillator region.

3. The detector array according to claim 2, wherein the scintillator material comprises at least one:
   Gadolinium Oxysulfide (GOS, $Gd_2O_2S$),
   Yttrium Aluminum Garnet (YAG, $Y_3Al_5O_{12}$),
   Cerium doped Yttrium Aluminum Garnet, (CE YAG, Ce $Y_3Al_5O_{12}$),
   Gadolinium Aluminum Gallium Garnet (GAGG $Gd_3Al_2GA_3O_{12}$),
   Cerium doped Gadolinium Aluminum Gallium Garnet (CE GAGG, Ce $Gd_3Al_2GA_3O_{12}$),
   Zinc Selenide (ZnSe), and
   Cadmium Tungstate ($CdWO_4$).

4. The a detector array according to of claim 1, wherein a major surface defined by a volume of the optically reflective barrier is disposed substantially parallel to a surface of the detector array that initially receives incident radiation.

5. The detector array according to claim 1, wherein the monolithic scintillator comprises a portion of a single bulk scintillator material of a plurality of detector elements, each monolithic scintillator of each detector element with a plurality of regions.

6. The detector array according to claim 1, wherein the monolithic scintillator is disposed adjacent to an array of photosensors, wherein the array of photosensors is disposed in a plane perpendicular to a surface of the detector array that initially receives X-ray radiation.

7. The detector array according to claim 1, wherein the monolithic scintillator is disposed between two arrays of photosensors, wherein each of the two arrays of photosensors is disposed in a plane parallel to a surface of the detector array that initially receives X-ray radiation.

8. A computed tomography system, comprising:
   an X-ray radiation source configured to emit X-ray radiation that traverses an examination region; and
   a detector array located opposite the X-ray radiation source across the examination region and comprising
   a monolithic scintillator that comprises
   at least a first scintillator region,
   a second scintillator region, and
   an optically reflective barrier therebetween;
   wherein the detector array is configured to detect X-ray radiation traversing the examination region and impinging the monolithic scintillator and generate first projection data indicative of an energy of x-ray radiation absorbed by the first scintillator region and second projection data indicative of an energy of x-ray radiation traversing the first scintillator and absorbed by the second scintillator region.

9. The system according to claim 8, wherein the monolithic scintillator comprises a portion of a physical bulk of scintillator material that is structurally altered by a laser to define the first scintillator region and the second scintillator region.

10. The system according to claim 8, wherein a major surface of a volume defining the optically reflective barrier is disposed substantially parallel to a surface of the detector array that initially receives the X-ray radiation.

11. The system according to claim 8, wherein the scintillator material comprises at least one of:
    Gadolinium Oxysulfide (GOS, $Gd_2O_2S$),
    Yttrium Aluminum Garnet (YAG, $Y_3Al_5O_{12}$),
    Cerium doped Yttrium Aluminum Garnet, (CE YAG, Ce $Y_3Al_5O_{12}$),
    Gadolinium Aluminium Gallium Garnet (GAGG $Gd_3Al_2GA_3O_{12}$),
    Cerium doped Gadolinium Aluminum Gallium Garnet (CE GAGG, Ce $Gd_3Al_2GA_3O_{12}$),
    Zinc Selenide (ZnSe), and
    Cadmium Tungstate ($CdWO_4$).

12. The system according to claim 8, wherein the monolithic scintillator comprises a portion of a single bulk scintillator material of a plurality of detector elements, each monolithic scintillator of each detector element with a plurality of regions.

13. The system according to claim 8, wherein the monolithic scintillator is disposed adjacent to an array of photosensors, wherein the array of photosensors is disposed in a plane perpendicular to a surface of the detector array that initially receives the X-ray radiation.

14. The system according to claim 8, wherein the monolithic scintillator is disposed between two arrays of photosensors, wherein each of the two arrays of photosensors is disposed in a plane parallel to a surface of the detector array that receives the X-ray radiation.

15. A method of manufacturing a computed tomography radiation detecting apparatus, comprising:
    altering a crystal structure of a portion of a single physical bulk of scintillator material by a focused laser to define a plurality of regions of a monolithic scintillator while maintaining the single physical bulk as a physically connected crystal structure, wherein the altered portion comprises a volume with a major surface oriented parallel to a surface of the detecting apparatus configured to initially receive X-ray radiation.

16. The method according to claim 15, wherein the altered portion of the single physical bulk further comprises a volume with a surface which is an exterior surface of the single physical bulk.

17. The method according to claim 15, wherein a direction of the laser is oriented parallel or perpendicular to a plane perpendicular to the surface of the detecting apparatus configured to initially receive X-ray radiation.

18. The method according to claim 15, wherein the portion of the single physical bulk of scintillator material altered comprises two volumes with major surfaces parallel to the surface of the detecting apparatus configured to initially receive incident radiation, and the major surfaces are parallel and separated by a distance between approximately 2 microns and 100 microns.

19. The method according to claim 15, wherein the single physical bulk of scintillator material comprises a plurality of monolithic scintillators in a one dimensional array of monolithic scintillators, each monolithic scintillator with the plurality of regions; and further comprising:

aligning and affixing the single physical bulk of scintillator material to a photosensor array, wherein the photosensor array is oriented perpendicular to the surface of the detecting apparatus configured to initially receive X-ray radiation.

20. The method according to claim 15, wherein the single physical bulk of scintillator material comprises a plurality of monolithic scintillators in a two dimensional array of scintillators, each monolithic scintillator with two regions; and further comprising:

aligning and affixing the single physical bulk of scintillator material between two photosensor arrays, wherein each of the two photosensor arrays is oriented parallel to the surface of the detecting apparatus configured to initially receive X-ray radiation.

* * * * *